United States Patent [19]
Wijaranakula

[11] Patent Number: 5,961,713
[45] Date of Patent: *Oct. 5, 1999

[54] METHOD FOR MANUFACTURING A WAFER HAVING A MICRODEFECT-FREE LAYER OF A PRECISELY PREDETERMINED DEPTH

[75] Inventor: Witawat Wijaranakula, Vancouver, Wash.

[73] Assignee: SEH America, Inc., Vancouver, Wash.

[ * ] Notice: This patent is subject to a terminal disclaimer.

[21] Appl. No.: 08/815,750

[22] Filed: Mar. 12, 1997

Related U.S. Application Data

[63] Continuation of application No. 08/382,751, Jan. 31, 1995, Pat. No. 5,611,855.

[51] Int. Cl.$^6$ .................................................. C30B 1/02
[52] U.S. Cl. .............................. 117/2; 438/142; 438/144; 117/935
[58] Field of Search .................................... 438/142, 144; 117/2, 935

[56] References Cited

U.S. PATENT DOCUMENTS

| | | | |
|---|---|---|---|
| 3,999,866 | 12/1976 | Mathisen | 356/244 |
| 4,386,850 | 6/1983 | Leahy | 356/243 |
| 4,437,922 | 3/1984 | Bischoff et al. | 156/603 |
| 4,512,659 | 4/1985 | Galbraith et al. | 356/243 |
| 4,579,601 | 4/1986 | Samata et al. | 148/1.5 |
| 4,637,123 | 1/1987 | Cazcarra et al. | 29/569 |
| 4,717,446 | 1/1988 | Nagy et al. | 156/626 |
| 4,766,317 | 8/1988 | Harbeke et al. | 250/358 |
| 4,767,660 | 8/1988 | Hosoda et al. | 428/209 |
| 4,770,536 | 9/1988 | Golberstein | 356/371 |
| 4,809,196 | 2/1989 | Miller | 364/550.01 |
| 4,899,055 | 2/1990 | Adams | 250/372 |
| 4,925,298 | 5/1990 | Dobrilla | 356/30 |
| 5,004,340 | 4/1991 | Tullis et al. | 356/243 |
| 5,078,492 | 1/1992 | Scheer | 356/243 |
| 5,144,524 | 9/1992 | Tullis et al. | 362/293 |
| 5,198,869 | 3/1993 | Monteverde et al. | 356/243 |
| 5,306,939 | 4/1994 | Mitani et al. | 257/372 |
| 5,332,470 | 7/1994 | Crotti | 156/659 |
| 5,611,855 | 3/1997 | Wijaranakula | 117/2 |

FOREIGN PATENT DOCUMENTS 60-027678  2/1985  Japan.

OTHER PUBLICATIONS

W.A. Pliskin, Silicon Dioxide Step Gauge, *IBM Technical Disclosure Bulletin*, vol. 5, No. 10, Mar. 1963, pp. 9–10.

C.A. Gaston, Standard Wafer For Intensity And Focus Testing, *IBM Technical Disclosure Bulletin*, vol. 24, No. 11A, Apr. 1982, pp. 5587–5589.

K. Moriya, et al., Development Of Bulk Microdefect Analyzers For Si Wafer, *J. Appl. Phys.*, 66(11), Dec. 1, 1989, pp. 5267–5273.

J. Andrews, Oxygen Out–Diffusion Model For Denuded Zone Formation In Czochralski–Grown Silicon With High Interstitial Oxygen Content, *Proceeding Of The Symposium On Defects In Silicon*, vol. 83–9, pp. 133–141.

Y. Kitagawara, et al., Characterization Of Near–Surface Micro–Defects In CZ–Si Wafers Produced By Various Crystal Pulling Conditions, *The Electro Chemical Society, Inc.*, vol. 94–1, May 1994, pp. 449–450.

*Primary Examiner*—Robert Kunemund
*Attorney, Agent, or Firm*—Alston & Bird LLP

[57] ABSTRACT

A semiconductor silicon wafer (10) useful as a calibration standard for measurement of a thickness (18) of a microdefect-free layer (16) is formed by depositing an epitaxial layer onto a substrate (12) having an interstitial oxygen concentration suitable for precipitating oxide. Large, uniform oxide microdefects (14) are formed in the substrate by maintaining the semiconductor silicon wafer at between 600° C. and 900° C. to nucleate oxide precipitates that are then grown at between 800° C. and 1,200° C. Because the epitaxial layer contains no oxide precipitate nuclei to form microdefects, the epitaxial layer remains a microdefect-free layer and has a relatively sharp, easily detectable boundary with the substrate. The epitaxial layer can be polished to a reduced thickness, if desired.

12 Claims, 5 Drawing Sheets

"METHOD FOR MANUFACTURING A WAFER
HAVING A MICRODEFECT-FREE LAYER OF
A PRECISELY PREDETERMINED DEPTH

This is a continuation of application Ser. No. 08/382,751 filed on Jan. 31, 1995 now U.S. Pat. No. 5,611,855.

TECHNICAL FIELD

This invention relates to semiconductor silicon wafers that have microdefect-free layers of precise depths and that are useful, for example, for calibrating equipment that measures the depth of microdefect-free layers.

BACKGROUND OF THE INVENTION

Modern integrated circuits ("ICs") are composed of up to several million individual electronic devices, such as transistors and capacitors, fabricated on and near the surface of a single-crystal wafer of a semiconductor material, such as silicon. Such devices are composed of features, such as regions having specific electrical properties, of less than one micron in size. Minute crystal imperfections and contamination, such as metals unintentionally introduced into the semiconductor during manufacturing processes, can change the electrical properties of the devices and adversely affect their performance.

It has been impossible to prevent the introduction of metallic contamination into the semiconductor wafers upon which integrated circuits are fabricated. IC manufacturers have, therefore, developed methods for trapping, or "gettering," the inevitable metallic contamination at locations away from the surface layer at which the electronic devices are fabricated.

One type of gettering, known as internal or intrinsic gettering, entails creating microdefects in the crystal structure of the silicon wafer. Microdefects such as dislocations and oxide precipitates are created in the bulk region of semiconductor silicon wafers, away from the surface region where the electronic devices are formed. Metallic contamination, which is randomly diffusing throughout the substrate, becomes trapped in the microdefects away from the electronic devices.

Internal gettering results in better device performance and increased yield, i.e., the number of good dies per wafer. The microdefects, however, must be formed only in regions away from the wafer surface, because an electronic device fabricated on a microdefect would not function as designed. Silicon wafers are processed, therefore, to create a bulk region in which microdefects are formed and a microdefect-free layer near the surface where the devices are to be fabricated. An optimized IC manufacturing process produces a well-defined microdefect-free layer in which the IC devices are fabricated.

Microdefects within a semiconductor silicon crystal are typically formed by precipitating oxides within the silicon as described in, for example, Andrews, "Oxygen Out-Diffusion Model for Denuded Zone Formation in Czochralski-Grown Silicon with High Interstitial Oxygen Contents" *Proceedings of the Symposium on Defects in Silicon* (1983). To provide oxygen for forming the oxides, a crystal ingot is typically grown with between 10 ppma and 50 ppma interstitial oxygen (All oxygen concentrations recited in this document are described with reference to the "Old ASTM" standard.) The oxygen typically enters the molten silicon from a quartz crucible used to hold the molten silicon during the crystal growing process. As the ingot cools in the growing furnace, oxide precipitation nuclei form therein.

The ingot is sliced into wafers, which, after several known preparatory steps, are polished to prepare their surfaces for integrated circuit fabrication. The wafers are then heated to a high temperature, typically between 1,100° and 1,200° C., to outdiffuse or drive off oxygen near their surfaces and thereby dissolve the oxide precipitate nuclei created as the crystal cooled in the growing furnace. The wafers are subsequently heated for several hours at a lower temperature, typically between 600° C. and 800° C., to nucleate oxide microdefects away from the surface. A third heating step at a temperature of between 900° C. and 1,200° C. for several hours grows or enlarges the microdefects.

Because the first, high temperature heating step drives away oxygen and dissolves the defect nuclei in a layer near the wafer surface, the oxide microdefects cannot form in that layer during the subsequent nucleation step, and the layer near the surface remains free of microdefects. The change in oxygen concentration from the bulk to the surface after the high temperature out-diffusion step is relatively shallow, so it is difficult to accurately determine at what distance below the wafer surface the oxygen concentration will be great enough to form microdefects. The shallow concentration gradient of the dissolved oxygen produces a relatively shallow concentration gradient of the microdefects from a high concentration in the bulk to substantially zero in the microdefect-free layer. This gradual change in microdefect density makes detecting the beginning of the microdefect-free layer difficult.

There are several methods for measuring the depth of the microdefect-free layer. One common method entails heat treating, cleaving, and then lapping the silicon wafer at a small angle, typically 1° to 2°. The wafer is then etched in a preferential etch solution, such as a known Wright, Secco, or Sirtle etch solution, to reveal the microdefects and oxide precipitates. The depth of the microdefect-free layer is then determined by manually measuring under an optical microscope the distance from the wafer surface to the etch pits corresponding to the microdefects. The depth of the microdefect-free layer can also be measured using automated equipment such as a light scattering tomograph, in which the light scattered from microdefects and oxide precipitates is detected. Other methods used to measure the thickness of the microdefect-free layer include an x-ray diffraction microscope, a differential interference contrast microscope, and a transmission electron microscope.

The accuracy of automated measurements methods depends on the size of the microdefects and on the background noise level from the optical and electronic components. It has been very difficult to obtain accurate measurements of microdefect-free layers because the variation in microdefect-free layer depth in the calibration wafers makes it virtually impossible to characterize the equipment noise so that its effect can be removed from subsequent measurements.

The inability to accurately measure the depth of microdefect layers has made it difficult to control the processes that form the microdefect layer, thereby reducing the quality and consistency of the semiconductor substrates used in integrated circuit fabrication.

SUMMARY OF THE INVENTION

An object of the present invention is, therefore, to provide semiconductor silicon calibration wafers having a precise depth of the microdefect-free layer.

Another object of this invention is to provide a method of calibrating automated equipment used to measure thicknesses of microdefect-free layers.

A further object of this invention is to provide calibration wafers for use as standards in measuring microdefect-free layers.

In accordance with the invention, a semiconductor silicon crystal ingot containing sufficient dissolved oxygen, typically between 10 ppma and 50 ppma, is grown, preferably by using a Czochralski process. The ingot is then sliced into wafers, which are processed using known methods to produce a semiconductor silicon substrate having a polished surface. An epitaxial layer of a predetermined thickness is deposited onto the semiconductor silicon substrate to produce an epitaxial silicon wafer. The epitaxial silicon wafer then undergoes a first, or nucleation, annealing step, in which it is maintained for a first period of time within a first temperature range to form oxide microdefects in the silicon wafer substrate. The epitaxial layer, however, contains no nucleation sites or nuclei to form microdefects.

The epitaxial silicon wafer then undergoes a second, or growth, annealing step, in which it is maintained at a second temperature for a second, typically extended period of time to grow or enlarge the microdefects. Such an extended annealing step produces within the silicon substrate large and uniform oxide microdefects that can be easily detected using manual or automated measuring equipment. The epitaxial layer remains substantially free of oxide microdefects, thereby providing a well-defined microdefect-free layer having the thickness of the epitaxial layer. The epitaxial layer can be polished to reduce the thickness of the microdefect-free layer to a desired value or to remove scratches or other defects from the surface. Because the epitaxial deposition process and the polishing process can both be accurately controlled, a microdefect-free layer having a precise, predetermined thickness can be produced.

By using an epitaxial layer to produce a microdefect-free layer, the present invention produces a calibration wafer significantly improved over the prior art method that uses a "drive-off" diffusion step to deplete oxygen near the wafer surface to create a microdefect-free layer. A wafer of the present invention includes a bulk region having a large, uniformly distributed oxide microdefects juxtaposed to a region substantially free of microdefects. The sharply contrasting appearances of the two regions and the relatively sharply defined boundary between them facilitates the measurement of the thickness of the microdefect free layer. A semiconductor silicon wafer of the present invention is, therefore, useful for determining the accuracy of measuring equipment and as a calibration standard.

In the present invention, the nucleation annealing process can be performed before or after the epitaxial deposition process. Several semiconductor silicon wafers having microdefect-free layers of various thicknesses can be manufactured and used to calibrate instruments used to measure thicknesses of microdefect-free layers.

Additional objects and advantages of the present invention will be apparent from the following detailed description of a preferred embodiments thereof, which proceeds with reference to the accompanying drawings.

DETAILED DESCRIPTION OF PREFERRED EMBODIMENTS

Figure 1:
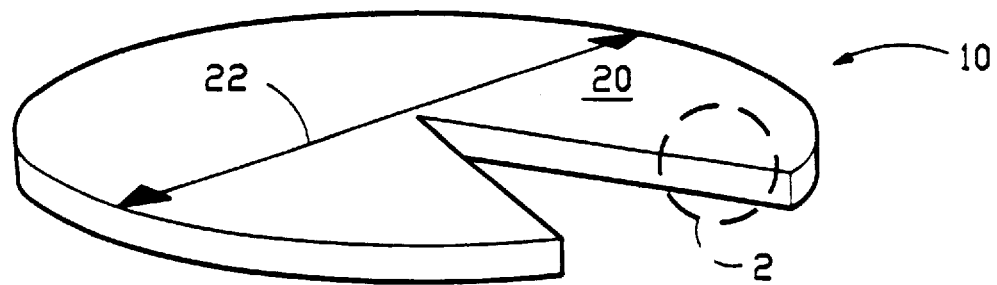
FIG. 1 is an isometric view of a silicon epitaxial wafer of the present invention, shown with a section broken away.
Figure 2:
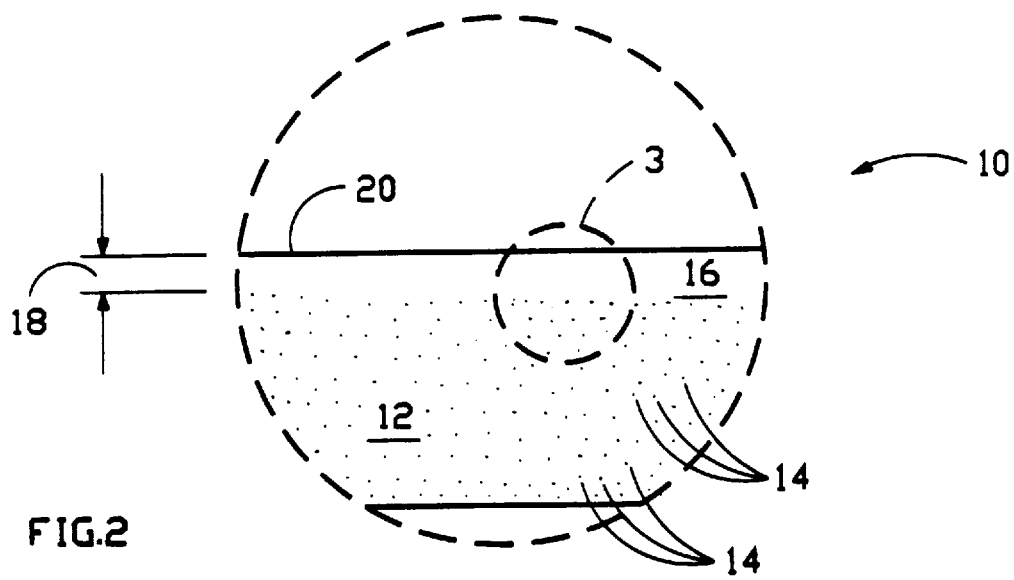
FIG. 2 is an enlarged, fragmentary, sectional view of the silicon epitaxial wafer of FIG. 1.
Figure 3:
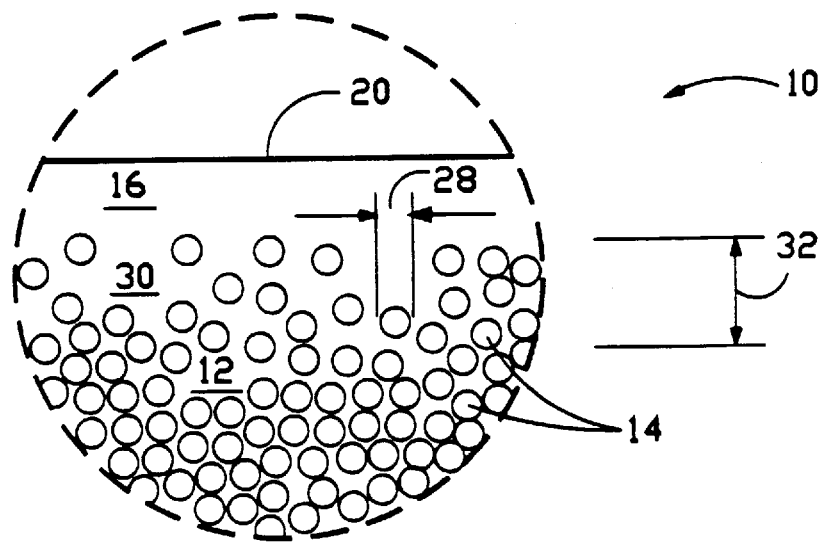
FIG. 3 is a further enlarged, fragmentary, sectional of the silicon epitaxial wafer of FIG. 1.

FIGS. 1, 2, and 3 shows a semiconductor silicon wafer 10 of the present invention. FIGS. 2 and 3 shows that silicon wafer 10 comprises a semiconductor silicon substrate 12 that contains multiple oxide microdefects 14 and a microdefect-free layer 16 having a precise thickness 18 and extending from a front surface 20 of semiconductor silicon wafer 10 to silicon substrate 12. Semiconductor silicon substrate 12 can be either intrinsic, i.e., having the conductivity of pure silicon, or extrinsic, i.e., having its conductivity changed by an added dopant such as boron, phosphorus, antimony, carbon, or arsenic. The concentration of the added dopant is preferably less than 300 ppma.

Semiconductor silicon substrate 12 has a diameter 22 (FIG. 1) of preferably between 50 mm and 400 mm and a dissolved oxygen concentration preferably of between 10 ppma and 50 ppma, or more preferably of between 15 ppma or 30 ppm, the oxygen concentration being measured before the formation of oxide microdefects 14. In one preferred semiconductor silicon substrate 12, diameter 22 is approximately 200 mm. The preferred semiconductor silicon substrate 12 is approximately 775 μm and includes approximately $3\times10^{18}$ atoms/cm$^3$ of a boron dopant and approximately 23 ppma oxygen, measured before the formation of microdefects 14. Microdefect-free layer 16 can also comprise an intrinsic or extrinsic semiconductor. It is preferably formed by chemical vapor phase epitaxial deposition and contains approximately $1\times10^{15}$ atoms/cm$^3$ of a boron dopant. It will be understood that the present invention can be practiced using semiconductor silicon substrates and epitaxial layers having wide ranges of thicknesses, dopants and dopant concentrations.

FIG. 3 shows that a typical microdefect 14 has a diameter 28 preferably greater than 0.1 μm and less than 10 μm, more preferably between 0.15 μm and 0.35, and most preferably of approximately 0.2 μm. The density of microdefects 14 in semiconductor silicon substrate 12 is preferably greater than $10^9$ defects/cm$^3$, more preferably between $10^9$ defects/cm$^3$ and $10^{11}$ defects/cm$^3$, and most preferably approximately $10^{10}$ defects/cm$^3$. A transition region 30 between semiconductor silicon substrate 12 and microdefect-free layer 16 has a width 32 of preferably 5 μm or less. Because transition region 30 is believed to be a manifestation of the random locations of the defect nucleation sites, a substrate 12 having a greater oxygen concentration, and, therefore, a greater concentration of defect sites, will have a smaller width 32.

Figure 4:
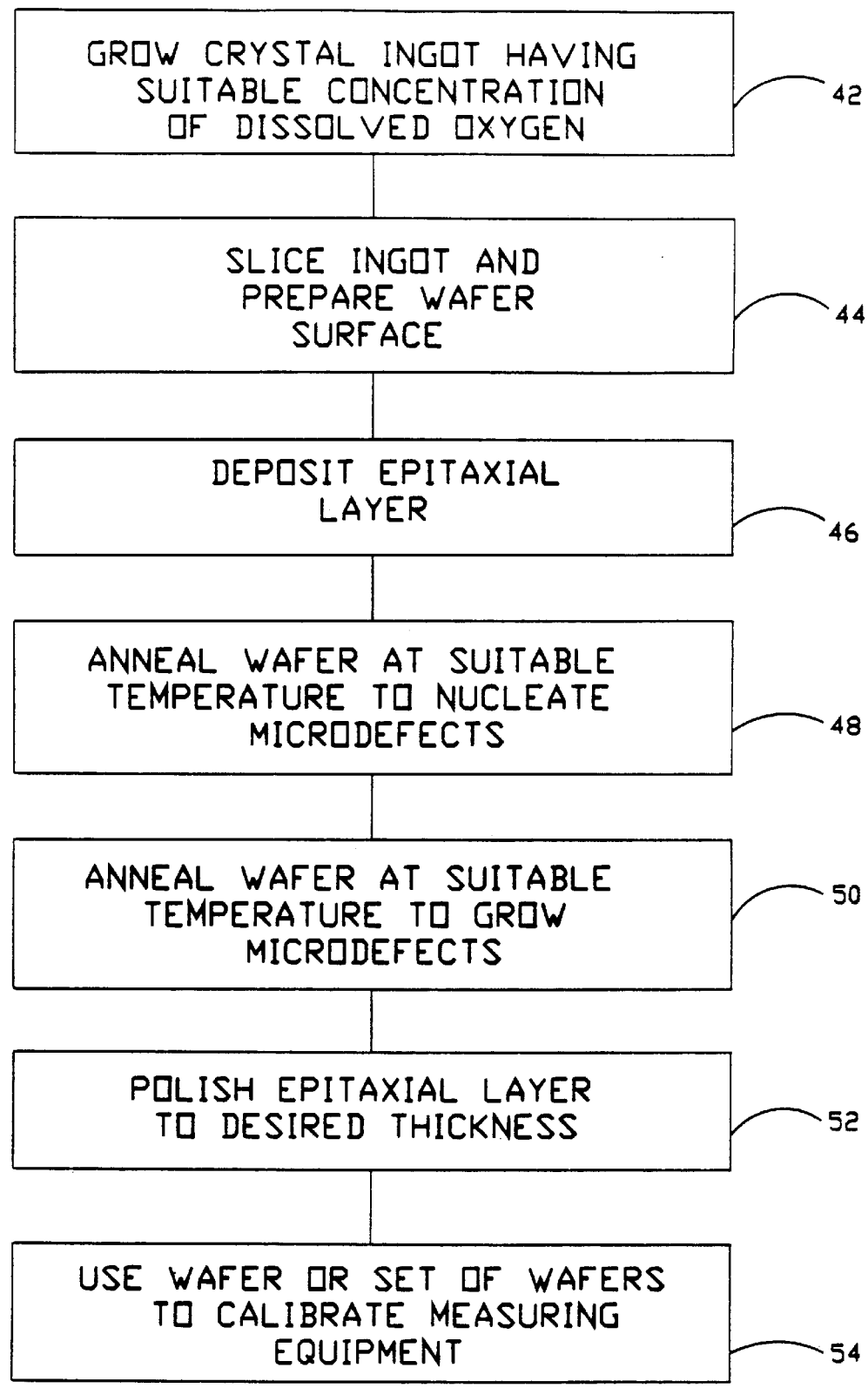
FIG. 4 is a flow chart showing the preferred process steps for producing the silicon epitaxial wafer of FIG. 1.

FIG. 4 illustrates a preferred method for producing the wafer of FIGS. 1, 2, and 3. Process step 42 indicates that an ingot of single crystal, semiconductor silicon is grown using a Czochralski process. The growth process is such as to ensure that the resulting crystal contains sufficient dissolved oxygen, typically between 10 ppma and 50 ppma, for forming microdefects 14.

After an ingot having the desired dissolved oxygen and dopant concentrations is grown, step 44 shows that the ingot is sliced into semiconductor silicon wafers, at least one of which is further processed to produce thereon a flat, polished front surface suitable for the fabrication of integrated circuits. The polished wafer forms a semiconductor silicon substrate 12, ready for process step 46, which entails depositing an epitaxial layer, preferably by chemical vapor deposition.

The epitaxial layer contains no sites or nuclei to form oxide microdefects during subsequent annealing steps and, therefore, provides a layer free of microdefects. Because substrate 12 does not undergo, as do prior art wafers, a heating step to drive off oxygen and dissolve the nucleation sites for oxide microdefects near its surface, the microdefects concentration is essentially more uniform throughout substrate 12, up to the deposited epitaxial layer. Transition region 30, the region that is at the boundary between substrate 12 and the epitaxial layer and that has a defect density between that of the microdefect-free region and that of the bulk region of substrate 12, is thus relatively small and the defect concentration gradient is steep relative to those of prior art wafers.

Because the epitaxial layer forms microdefect-free layer 16, the thickness of the deposited epitaxial layer can be the same as or greater than that of the desired thickness 18 of microdefect-free layer 16. The epitaxial layer typically has a thickness of between 5 $\mu$m and 100 $\mu$m, although epitaxial layers of any thickness could be used in the present invention. In three different embodiments, epitaxial layers having thicknesses of 5 $\mu$m, 10 $\mu$m, and 30 $\mu$m were deposited onto three semiconductor silicon substrates 12.

Process step 48 shows that semiconductor silicon substrate 12, along with the deposited epitaxial layer, is annealed at a temperature suitable to nucleate oxide microdefects, preferably between 600° C. and 900° C. and more preferably between 650° C. and 750° C., for an extended period of time, preferably for longer than 24 hours and more preferably between 48 hours and 72 hours. Annealing for longer than 120 hours typically produces no significant additional benefit. The optimum temperature and duration within the above-described ranges are interrelated, depend upon the dissolved oxygen content of substrate 12, and can be determined by skilled persons. In one preferred embodiment, wafers having a dissolved oxygen concentration of 23 ppma were annealed at 650° C. for approximately 100 hours in a nitrogen ambient environment. During process step 48, some of the oxygen dissolved in semiconductor silicon substrate 12 precipitates and forms oxide microdefects, which are distributed throughout substrate 12.

Process step 50 shows that semiconductor silicon substrate 12, along with the deposited epitaxial layer, is annealed at a temperature suitable to grow the oxide microdefects 14 that were nucleated in process step 48. Process step 50 typically entails maintaining semiconductor silicon substrate 12 at a temperature preferably between 850° C. and 1,200° C. and more preferably between 1,000° C. and 1,100° C., for an extended period of time, preferably for more than 8 hours and less than 50 hours and more preferably for between 10 hours and 16 hours. The duration of the growth annealing of process step 50 is typically less than that of the nucleation annealing of step 48. The optimum temperature and duration within the above-described ranges are interrelated, depend upon the oxygen concentration of substrate 12, and can be determined by a skilled person. In one preferred embodiment, wafers were annealed at approximately 1,000° C. for 16 hours in a dry $O_2$ ambient environment. During process step 50 the nuclei of oxide microdefects formed during process step 48 increase in size as more of the dissolved oxygen combines with silicon at the defect site to form additional oxide. After step 50, semiconductor silicon substrate 12 includes large, easily detectable microdefects 14 having a relatively uniform size and concentration.

Optional process step 52 shows that a microdefect-free layer 16 having a desired thickness 18 can be formed by polishing off a portion of the epitaxial layer of silicon semiconductor wafer 10. Polishing can removes scratches and other surface defects that could affect measurements of the defect-free layer thickness. The epitaxial layer contains virtually no microdefects 14 and forms, therefore, a microdefect-free layer 16 having a precise thickness 18. Annealing steps 48 and 50 produce large, uniform oxide microdefects that are easily detectable by a light scattering microscope tomograph or a differential interference contrast microscope.

Step 48, the defect nucleation annealing step, can be performed before step 46, the epitaxial deposition step. The structural microdefect nucleated at the surface of silicon semiconductor substrate 12 could, however, then propagate into the epitaxial layer.

Calibration step 54 indicates that wafer 10 or a set of wafers 10 having microdefect-free layers 16 of different thickness 18 can be used to calibrate measuring equipment, such as a light scattering microscope tomograph or a differential interference contrast microscope.

The concentration of microdefects 14 decreases over a finite transition region 30 from a relatively high concentration in the substrate bulk to approximately zero. Because the boundary of microdefect-free layer 16 has a finite width, one can choose any of several measurable parameters to characterize its thickness. For example, one can define the thickness as the distance from the wafer surface to the first detectable microdefect 14 or to a point where the microdefect density is a particular percentage value of the bulk microdefect density.

Figure 5:
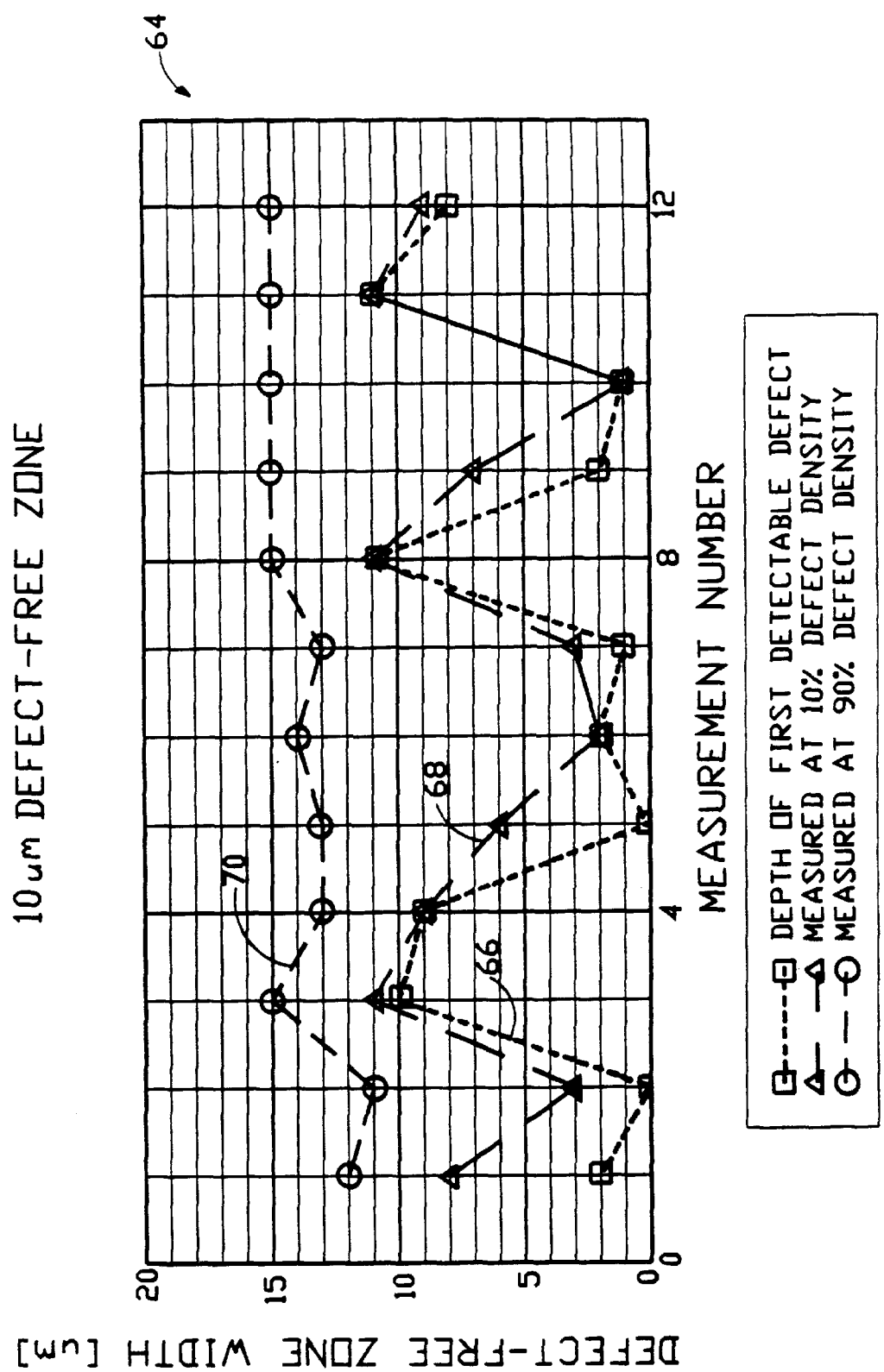
FIG. 5 is a graph showing thickness measurements of a 10 μm microdefect-free layer formed by prior art processes.
Figure 6:
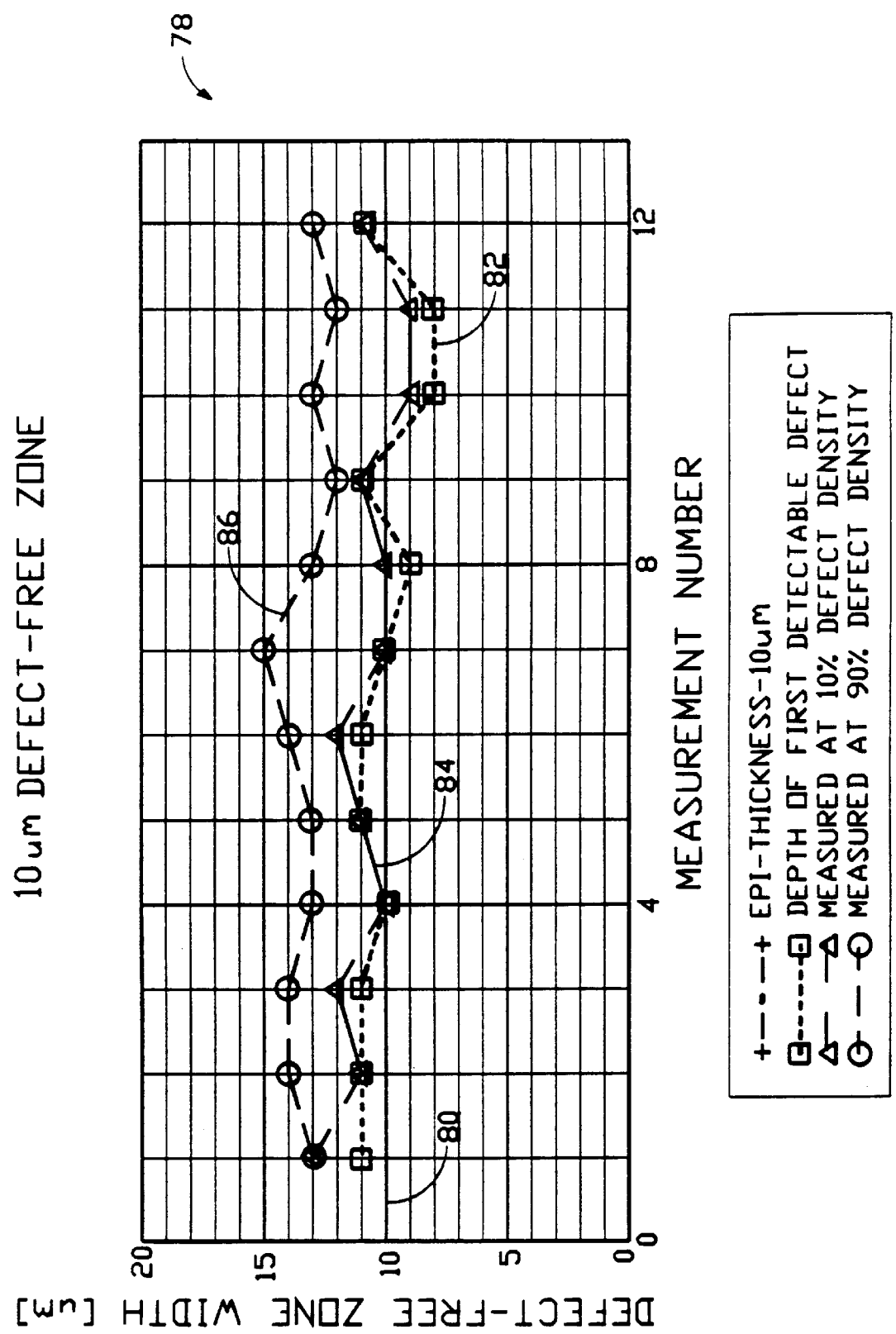
FIG. 6 is a graph showing thickness measurements of a 10 μm microdefect-free layer formed in accordance with the present invention.
Figure 7:
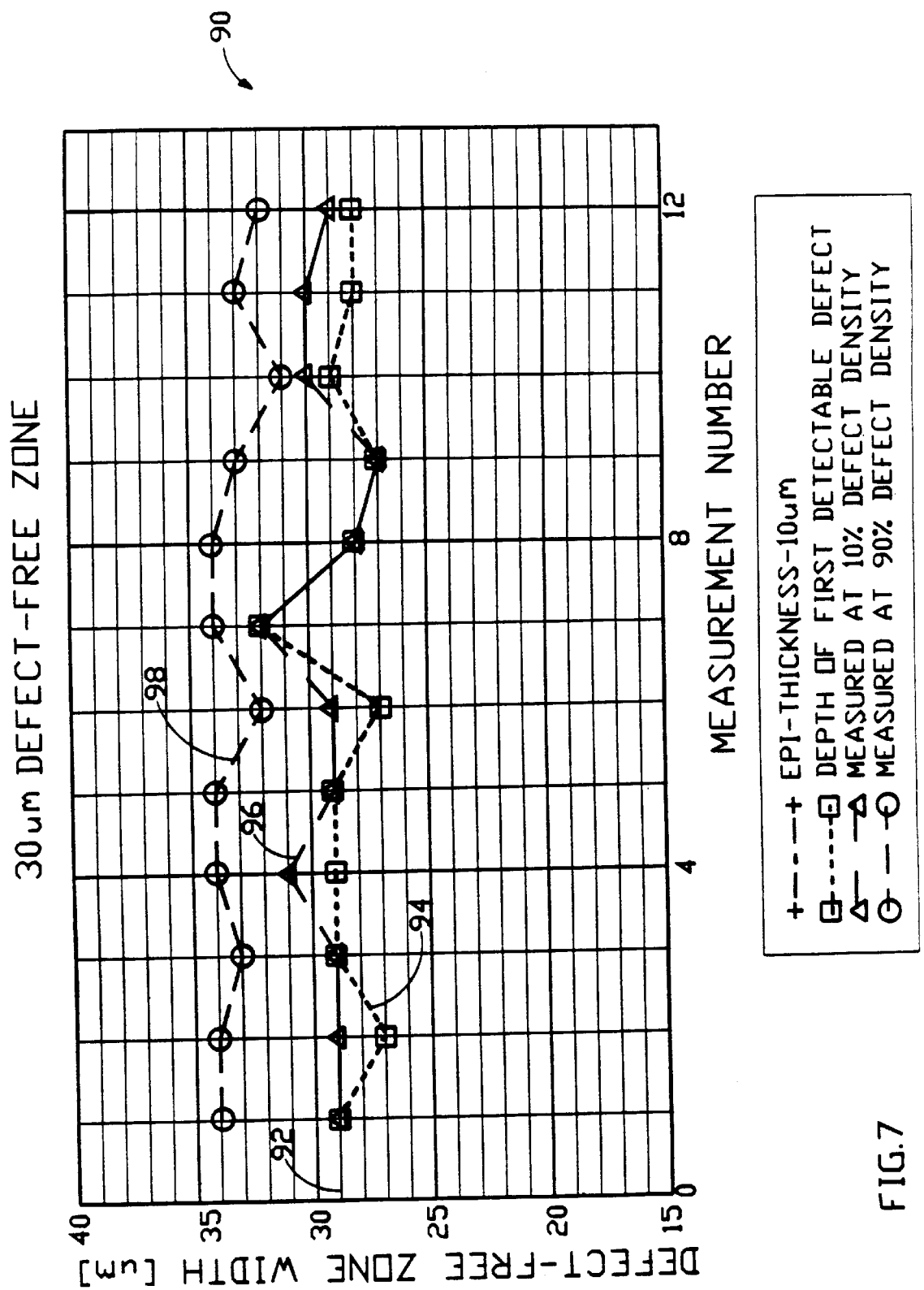
FIG. 7 is a graph showing thickness measurements of 30 μm microdefect-free layers formed in accordance with the present invention.

FIGS. 5, 6, and 7 each show, for a different wafer, the results of twelve repetitive measurements of three different parameters used to characterize the microdefect-free layer thickness of the wafer. The three parameters are (1) the distance from the wafer surface to the first detected microdefect, (2) the distance from the wafer surface to the point at which the microdefect density is ten percent of the bulk microdefect density, and (3) the distance from the wafer surface to the point at which the microdefect density is ninety percent of the bulk microdefect density.

FIG. 5 shows a graph 64 of thickness measurements of an approximately 10 $\mu$m thick microdefect-free layer formed using a prior art, three-step annealing process that includes a step to outdiffuse or drive off oxygen at the wafer surface. A line 66 represents twelve repetitive measurements at the approximate center of the wafer of the distance from the wafer surface to the first detectable defect. Line 66 shows that the thickness values obtained from such repetitive measurements of the microdefect-free layer vary from 0 $\mu$m to 11 $\mu$m. A line 68 shows the result of twelve repetitive measurements at the approximate center of the wafer of the distance from the wafer surface to a point at which the microdefect density is approximately ten percent of the bulk microdefect density. Line 68 shows that such thickness measurements of the microdefect-free zone vary from 1 $\mu$m to 11 $\mu$m.

The variation in the measurements of the microdefect-free layer thickness are caused in part by the nonuniformity of the microdefects size and microdefect density in the transition region and by relatively gradual change in microdefect density between the bulk and the microdefect-free layer created by the conventional three-step anneal. Such measurement variations makes accurate calibration and control of measurement devices virtually impossible.

A line 70 shows the result of twelve repetitive measurements of the distance from the surface of the wafer to the point at which the microdefect density is ninety percent of the bulk microdefect density. The measurements shown on line 70 vary from 11 µm to 15 µm. Although the measurement values of this parameter are the most stable of the three parameters measured and shown in FIG. 5, it is the least useful indicator of microdefect-free layer thickness because it does not indicate how far the microdefects begin below the surface layer in which circuitry will be fabricated.

FIG. 6 shows a graph 78, similar to that of FIG. 5, showing the results of twelve repetitive measurement of an approximately 10 µm microdefect-free layer formed using the method of the present invention. A line 80, having no analogy in FIG. 5, shows that the thickness of the deposited epitaxial layer is 10 µm. A line 82 shows that the measurements of the distance from the surface 20 of wafer 10 to the first observable microdefect varies from 8 µm to 11 µm. The measured distances are approximately the same as the actual epitaxial layer thickness. (Measured distances of less than 10 µm could be due to measurement inaccuracies.)

A line 84 shows that the distance from wafer surface 20 to a point at which the microdefect density is ten percent of the bulk microdefect density varies between 9 µm and 13 µm. The range of these repeated measurements of the wafer 10 of the present invention is much smaller than the range of corresponding repeated measurements of the prior art wafers of FIG. 5, line 68, because the microdefects within transition region 30 of a wafer of the present invention are more readily detectable by the measuring equipment or observer. Moreover, the difference between the point at which the microdefect density is ninety percent of the bulk microdefect density and the point at which the microdefect density is ten percent of the bulk density is much smaller for wafer 10 of the present invention, thereby indicating that the transition region 30 between the bulk microdefect density and the microdefect-free layer has a smaller width 32. Measurements of the microdefect-free layer are more reliable because the smaller transition layer and the uniform microdefects 14 improves the accuracy and consistency of measurement.

FIG. 7 shows a graph 90 similar to that of FIG. 6 but showing the results of twelve repetitive measurement of a 30 µm microdefect-free layer 16 formed using the method of the present invention. A line 92 shows that the thickness of the deposited epitaxial layer is 30 µm. A line 94 shows that measurements of the distance from surface 20 to the first observable microdefect varies from 27 µm to 32 µm, which measurements are close to the actual epitaxial layer thickness and have a smaller range than the measurements of the prior art wafer of FIG. 4.

A line 96 shows that the distance between the wafer surface and a point at which the microdefect density is ten percent that of the bulk microdefect density also varies between 27 µm and 32 µm. The range of the repeated measurements of the wafer 10 of the present invention is similar to that of the 10 µm microdefect-free layer of FIG. 6, line 84, and much smaller than the measurement range of the prior art wafers shown in FIG. 5, line 68. A line 98 shows that measurements of the distance from the wafer surface 20 to a point at which the microdefect density is ninety percent that of the bulk microdefect density vary between 31 µm and 34 µm.

The similarity of the measurement ranges and accuracies for 10 µm layers and for 30 µm layers shows that the present invention can be used to create precise microdefect-free layers of different thicknesses for use as calibration wafers. The relatively small distance between the point at which the microdefect density is ninety percent of the bulk defect density and the point at which the microdefect density is ten percent of the bulk defect density shows that the present invention also provides a smaller transition region between the bulk microdefect density layer and the microdefect-free layer for wafers of the present invention having thicker microdefect-free layers.

It will be obvious that many changes may be made to the above-described details of the invention without departing from the underlying principles thereof. The scope of the present invention should, therefore, be determined only by the following claims.

I claim:

1. A method of manufacturing a semiconductor silicon wafer including a semiconductor silicon bulk region having easily detectable microdefects and an epitaxially deposited microdefect-free layer, comprising:

providing a semiconductor silicon substrate having sufficient interstitial oxygen to form oxide microdefects;

depositing an epitaxial layer onto the semiconductor silicon substrate, the semiconductor substrate having throughout the substrate sufficient dissolved oxygen to form oxide microdefects and the epitaxial layer having no nucleation sites to form oxide microdefects;

heating the semiconductor silicon substrate for a first period of time to nucleate oxide microdefects within the substrate; and heating the semiconductor silicon substrate for a second predetermined time, less than the first period of time, to grow the easily detectable oxide microdefects within the semiconductor silicon substrate, the epitaxial layer providing a microdefect-free layer easily distinguishable from the semiconductor silicon substrate having microdefects.

2. The method of claim 1 in which:

providing a semiconductor silicon substrate includes providing a semiconductor silicon substrate having between 10 and 50 parts per million absolute dissolved oxygen;

maintaining the semiconductor silicon substrate within a first temperature range includes maintaining the semiconductor silicon substrate within a temperature range of between 600° C. and 900° C.; and maintaining the semiconductor silicon substrate within a second temperature range includes maintaining the semiconductor silicon substrate within a temperature range of between 1,000° C. and 1,200° C.

3. The method of claim 1 in which maintaining the semiconductor silicon substrate within a first temperature range includes maintaining the semiconductor silicon substrate within the first temperature range for more than 24 hours.

4. The method of claim 1 in which maintaining the semiconductor silicon substrate within a second temperature range includes maintaining the semiconductor silicon substrate within the second temperature range for more than 8 hours.

5. The method of claim 1 in which:

maintaining the semiconductor silicon substrate within a first temperature range includes maintaining the semiconductor silicon substrate within a temperature range of between 600° C. and 900° C. for between 24 and 120 hours; and maintaining the semiconductor silicon substrate within a second temperature range includes maintaining the semiconductor silicon substrate within a temperature range of between 1,000° C. and 1,200° C. for between 8 and 16 hours.

6. The method of claim 1 in which maintaining the semiconductor silicon substrate within a first temperature range includes maintaining the semiconductor silicon substrate within a temperature range of between 650° C. and 750° C. and maintaining the semiconductor silicon substrate within a second temperature range includes maintaining the semiconductor silicon substrate within a temperature range of between 1050° C. and 1100° C.

7. The method of claim 1 in which maintaining the semiconductor silicon substrate within a first temperature range includes maintaining the semiconductor silicon substrate within the first temperature range for a sufficient period of time to produce a semiconductor silicon wafer having a microdefect density of at least $10^9$ defects/cm$^3$ as measured after the steps of maintaining the semiconductor substrate within the first and second temperature ranges.

8. The method of claim 1 in which maintaining the semiconductor silicon substrate within a second temperature range includes maintaining the semiconductor silicon substrate within the second temperature range for a sufficient period of time to produce in the semiconductor silicon substrate an average microdefect diameter greater than approximately 0.1 $\mu$m.

9. The method of claim 1 further comprising polishing the epitaxial layer to produce a microdefect-free layer of a precise thickness.

10. The method of claim 1 in which depositing an epitaxial layer precedes maintaining the semiconductor silicon substrate within a first temperature range.

11. A method of calibrating a device for measuring a depth of a microdefect-free layer on a semiconductor device, comprising:

providing a semiconductor silicon substrate having sufficient interstitial oxygen to form oxide microdefects;

maintaining the semiconductor silicon substrate within a temperature range to form oxide microdefects within the substrate;

depositing an epitaxial layer onto the semiconductor silicon substrate after the formation of oxide microdefects within the substrate, the epitaxial layer having essentially no nucleation site to form oxide microdefects;

maintaining the semiconductor silicon substrate and the overlying epitaxial layer within a second temperature range to grow easily detectable oxide microdefects within the semiconductor silicon substrate, the epitaxial layer providing a microdefect-free layer easily distinguishable from the semiconductor silicon substrate having microdefects; and measuring the known precise depth of the epitaxial layer to provide a standard for comparing a microdefect-free layer of unknown depth.

12. The method of claim 11 in which providing a semiconductor silicon substrate includes providing a semiconductor silicon substrate having between 10 and 50 parts per million absolute dissolved oxygen.

* * * * *